(12) United States Patent
Song

(10) Patent No.: US 7,428,179 B2
(45) Date of Patent: Sep. 23, 2008

(54) APPARATUS FOR CONTROLLING ACTIVATION OF SEMICONDUCTOR INTEGRATED CIRCUIT AND CONTROLLING METHOD OF THE SAME

(75) Inventor: Ho-Uk Song, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 37 days.

(21) Appl. No.: 11/541,572

(22) Filed: Oct. 3, 2006

(65) Prior Publication Data

US 2007/0086259 A1   Apr. 19, 2007

(30) Foreign Application Priority Data

Oct. 19, 2005   (KR) .................... 10-2005-0098575

(51) Int. Cl.
*G11C 7/00* (2006.01)
*G11C 8/00* (2006.01)

(52) U.S. Cl. .............. 365/196; 365/222; 365/230.03
(58) Field of Classification Search ........... 365/222, 365/203.03, 189.04, 196
See application file for complete search history.

(56) References Cited

U.S. PATENT DOCUMENTS

| | | | |
|---|---|---|---|
| 5,999,472 A | 12/1999 | Sakurai | |
| 6,079,023 A | 6/2000 | Yoon et al. | |
| 6,108,252 A | 8/2000 | Park | |
| 6,178,135 B1 | 1/2001 | Kang | |
| 6,215,719 B1 | 4/2001 | Anraku | |
| 6,256,249 B1 * | 7/2001 | Phelan | 365/222 |
| 6,754,126 B2 * | 6/2004 | Yamaguchi et al. | 365/222 |
| 6,772,271 B2 | 8/2004 | Fujii | |
| 6,809,979 B1 * | 10/2004 | Tang | 365/222 |
| 6,842,382 B2 | 1/2005 | Kim et al. | |
| 2005/0013185 A1 * | 1/2005 | Kim et al. | 365/222 |

FOREIGN PATENT DOCUMENTS

| | | |
|---|---|---|
| JP | 11-096752 | 4/1999 |
| JP | 2000-011656 | 1/2000 |
| JP | 2005-056529 | 3/2005 |
| KR | 1020030000844 A | 1/2003 |
| KR | 1020040008333 A | 1/2004 |
| KR | 1020050059790 A | 6/2005 |
| WO | WO-2005/041198 A1 | 5/2005 |

* cited by examiner

*Primary Examiner*—Ly D Pham
(74) *Attorney, Agent, or Firm*—Venable LLP; Jeffri A. Kaminski

(57) ABSTRACT

A circuit for controlling an active period of semiconductor memory apparatus includes: an active controller that generates active control signals for determining active periods of two or more individual banks according to whether a refresh operation is performed; and an active signal generator that generates an active signal for each of the banks so as to correspond to the active control signal. According to this structure, it is possible to reduce current consumption to a minimum in a refresh mode, to easily arrange signal lines, and thus to effectively use extra space.

14 Claims, 7 Drawing Sheets

APPARATUS FOR CONTROLLING ACTIVATION OF SEMICONDUCTOR INTEGRATED CIRCUIT AND CONTROLLING METHOD OF THE SAME

BACKGROUND

1. Technical Field

The present invention relates to semiconductor memory apparatus, and more particularly, to an apparatus and method for controlling an active period of semiconductor memory apparatus.

2. Related Art

In general, in a semiconductor memory apparatus, the entire memory cell is divided by banks in order to easily perform data read and write operations and other operations related to the data read and write operations. With the development of technology, the capacity of memory is increasing, which causes the number of banks to increase.

A large number of banks causes an increase in current consumption. Therefore, a method of reducing current consumption is needed.

Hereinafter, an apparatus for controlling an active period of semiconductor memory apparatus according to the related art will be described with reference to the accompanying drawings.

FIG. 1 is a block diagram illustrating the configuration of the apparatus for controlling an active period of a semiconductor memory apparatus according to the related art. FIG. 2 is a circuit diagram illustrating the internal structure of an active control unit shown in FIG. 1. FIG. 3 is a circuit diagram illustrating the internal structure of an active signal generating unit shown in FIG. 1.

As shown in FIG. 1, the apparatus for controlling an active period of a semiconductor memory apparatus according to the related art includes an active controller 10 that generates an active control signal for determining the active period of each bank, a precharge signal generator 20 that generates a precharge signal for each bank by using the active control signal, and an active signal generator 30 that generates an active signal for each bank by using the active control signal.

FIG. 1 shows a structure having four banks B0 to B3.

The active controller 10 includes first to fourth active control units 11 to 14 for generating active control signals TRASMIN0 to TRASMIN3, respectively. The first to fourth active control units 11 to 14 have the same structure, and the internal structure of the first active control unit 11 is described below as a representative example. As shown in FIG. 2, the first active control unit 11 includes an inverter 15 that inverts an active signal BA0_DLY delayed by a predetermined amount of time, a NAND gate 16 that receives the output of the inverter 15 and a high-level power supply signal VDD, an inverter 17 that inverts the output of the NAND gate 16, and a delay element 18.

The precharge signal generator 20 includes first to fourth precharge signal generating units 21 to 24 for generating precharge signals APCG0 to APCG3 on the basis of the active control signals TRASMIN0 to TRASMIN3, respectively.

The active signal generator 30 includes first to fourth active signal generating units 31 to 34 for generating active signals BA0 to BA3 for the active control signals TRASMIN0 to TRASMIN3, respectively. The first to fourth active signal generating units 31 to 34 have the same structure, and the internal structure of the first active signal generating unit 31 is described below as a representative example. As shown in FIG. 3, the first active signal generating unit 31 includes: a first NOR gate 31-1 that receives a pulse FACT0 generated according to an external active instruction and a pulse ACT0 generated according to an internal active instruction and determines whether to output the active signal; a second NOR gate 31-2 that receives a reset signal RST and a precharge signal PRE0 and determines whether to output the active signal; a third NOR gate 31-3 that receives an auto-precharge signal APCG0 and the active control signal TRASMIN0 and determines whether to output the active signal; a latch 31-4 that holds the output of the first NOR gate 31-1 on the basis of the output of the second NOR gate 31-2 or the third NOR gate 31-3; and a driver 31-5 that drives the output of the latch 31-4.

Each of the precharge signals APCG0 to APCG3 are input to the first to fourth active signal generating units 31 to 34, respectively. In addition, each of the active signals BA0 to BA3 are input to the first to fourth active control units 11 to 14, respectively.

The operation of the apparatus having the above-mentioned structure according to the related art will be described below.

The first to fourth active control units 11 to 14 of the active controller 10 output the active control signals TRASMIN0 to TRASMIN3, respectively.

Then, the first to fourth precharge signal generating units 21 to 24 of the precharge signal generator 20 generate the precharge signals APCG0 to APCG3 on the basis of the active control signals TRASMIN0 to TRASMIN3, respectively.

The first to fourth active signal generating units 31 to 34 of the active signal generator 30 generate the active signals BA0 TO BA3 so as to be suitable for the active control signals TRASMIN0 to TRASMIN3, respectively, and supply the generated active signals BA0 TO BA3 to a circuit for driving word lines corresponding to the banks B0 to B3.

The active control signals TRASMIN0 to TRASMIN3 are signals for determining the active periods of the active signals BA0 to BA3, for example the end times of high level periods, respectively. After the active control signals TRASMIN0 to TRASMIN3 turn to a high level and then a predetermined time delay occurs, the active signals BA0 to BA3 are disabled.

Meanwhile, in a semiconductor memory apparatus, particularly a DRAM, cell data is damaged with time due to structural characteristics. Therefore, a refresh operation is required to prevent damage.

The refresh operations are divided into an auto-refresh operation that is performed according to instructions from an external system of the semiconductor memory apparatus and a self-refresh operation that is performed in the semiconductor memory apparatus. The auto-refresh operation and the self-refresh operation are performed on the banks at the same time. That is, the auto-refresh operation and the self-refresh operation are performed on all the banks, not a specific bank.

However, the semiconductor memory apparatus according to the related art has the following problems.

First, each active control unit generates a separate active control signal for each active signal generating unit during the refresh operation. Therefore, current consumption increases during the refresh operation. In addition, the larger the number of banks becomes, the higher current consumption becomes.

Second, additional signal lines for supplying the active control signals to the active signal generating units are needed. Therefore, the arrangement of the signal lines is complicated. In addition, the larger the number of banks becomes, the more complicated the arrangement of signal lines becomes.

SUMMARY

Embodiments of the present invention provide an apparatus and method for controlling an active period of semiconductor memory apparatus capable of reducing current consumption during a refresh operation.

Embodiments of the present invention also provide an apparatus and method for controlling an active period of a semiconductor memory apparatus capable of reducing the number of signal lines for supplying active control signals.

According to a first embodiment of the present invention, there is provided a circuit for controlling an active period of a semiconductor memory apparatus. The circuit includes: an active controller that generates active control signals for determining active periods of two or more individual banks according to whether a refresh operation is performed; and an active signal generator that generates an active signal for each of the banks so as to correspond to the active control signal.

According to a second embodiment of the invention, there is provided a method of controlling an active period of semiconductor memory apparatus having two or more banks, two or more active control units, each generating an active control signal for determining the active period of the bank according to whether a refresh operation is performed, and two or more active signal generating units, each generating an active signal for the bank so as to correspond to the active control signal. The method includes: allowing some of the active control units to generate the active control signals regardless of whether the refresh operation is performed; and allowing the other active control units to generate the active control signals according to whether the refresh operation is performed.

BRIEF DESCRIPTION OF THE DRAWINGS

The above and other features and advantages of the present invention will become more apparent by describing in detail preferred embodiments thereof with reference to the attached drawings in which.

DESCRIPTION OF EXEMPLARY EMBODIMENTS

Hereinafter, preferred embodiments of the invention will be described with reference to the accompanying drawings.

Figure 1:
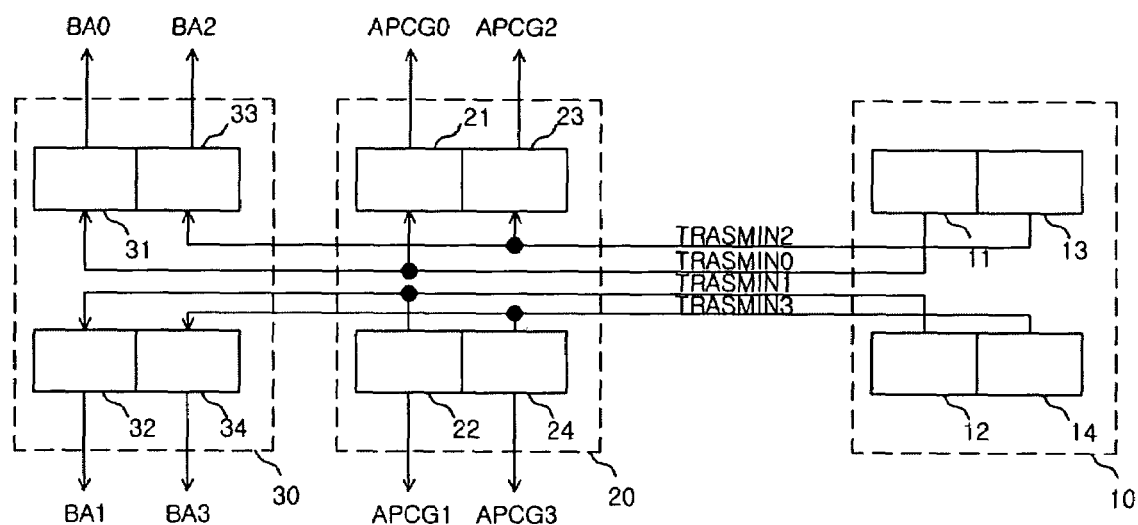
FIG. 1 is a block diagram illustrating the structure of an apparatus for controlling an active period of a semiconductor memory apparatus according to the related art.
Figure 2:
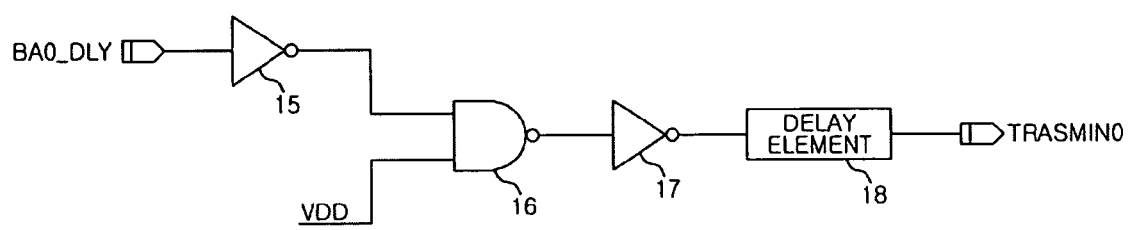
FIG. 2 is a circuit diagram illustrating the internal structure of an active control unit shown in FIG. 1.
Figure 3:
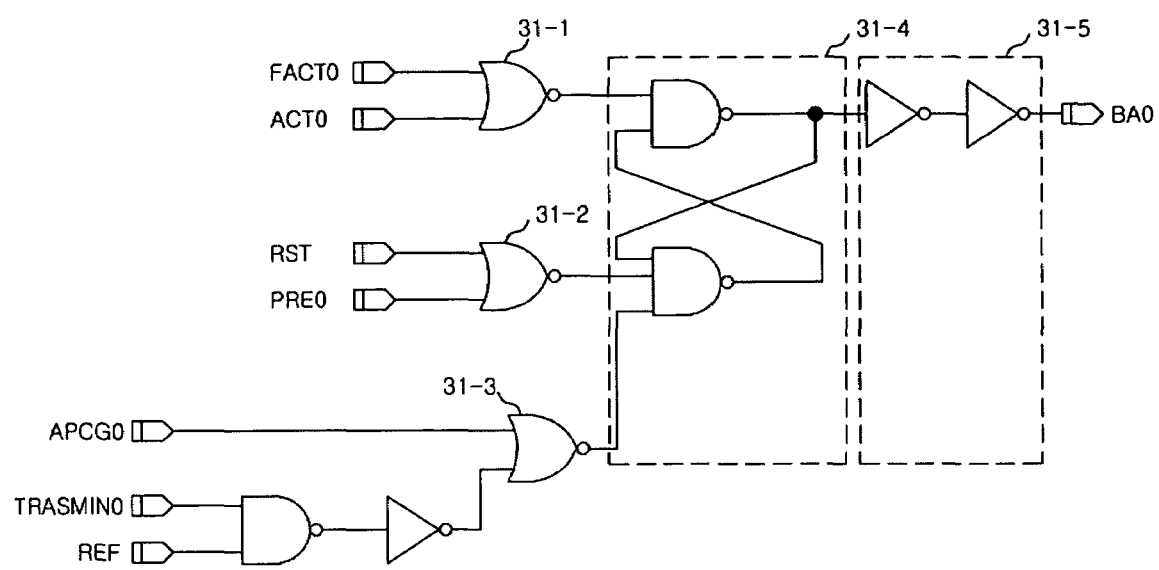
FIG. 3 is a circuit diagram illustrating the internal structure of an active signal generating unit shown in FIG. 1.
Figure 4:
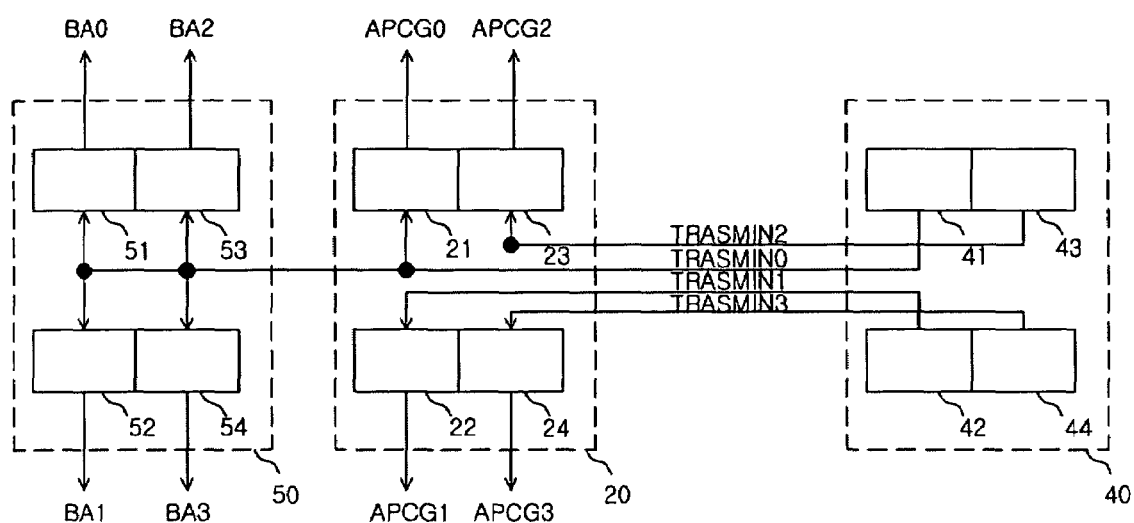
FIG. 4 is a block diagram illustrating the structure of an apparatus for controlling an active period of a semiconductor memory apparatus according to an embodiment of the present invention.
Figure 5:
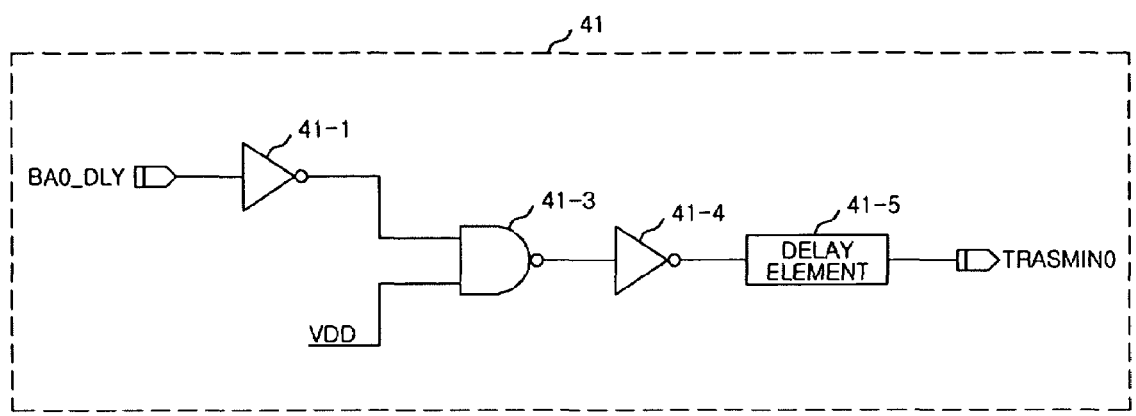
FIG. 5 is a circuit diagram illustrating the internal structure of an active control unit shown in FIG. 4.
Figure 5:
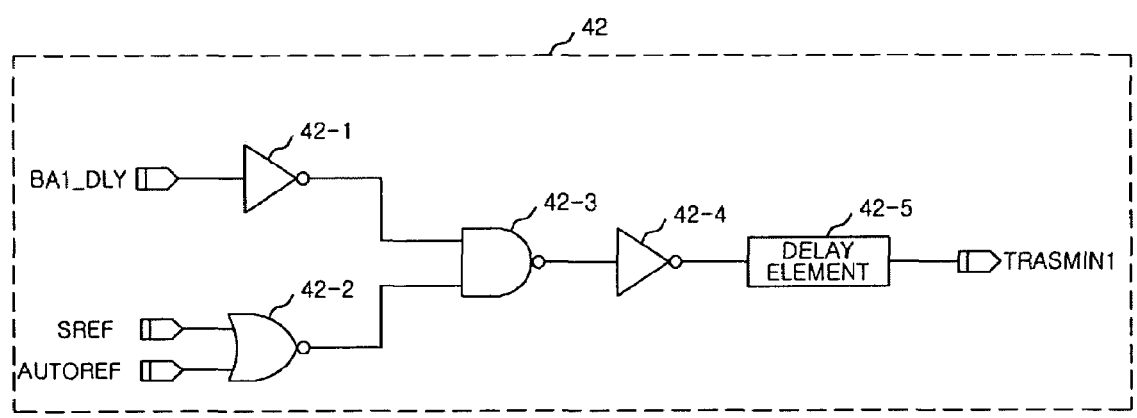
Figure 6:
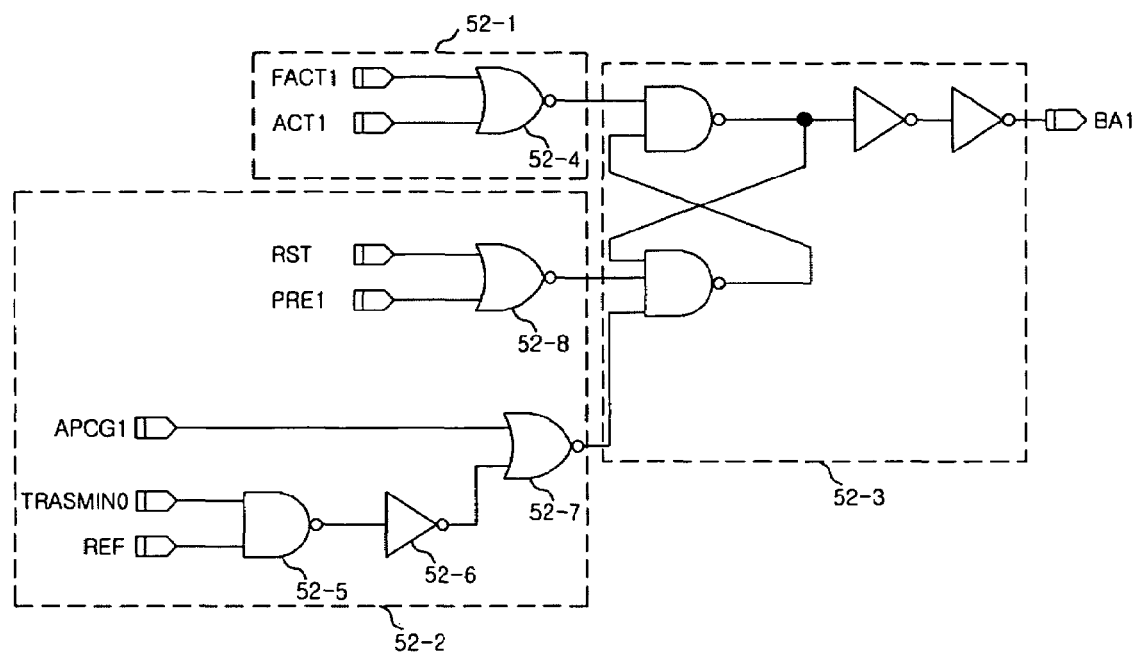
FIG. 6 is a circuit diagram illustrating the internal structure of an active signal generating unit shown in FIG. 4.
Figure 7:
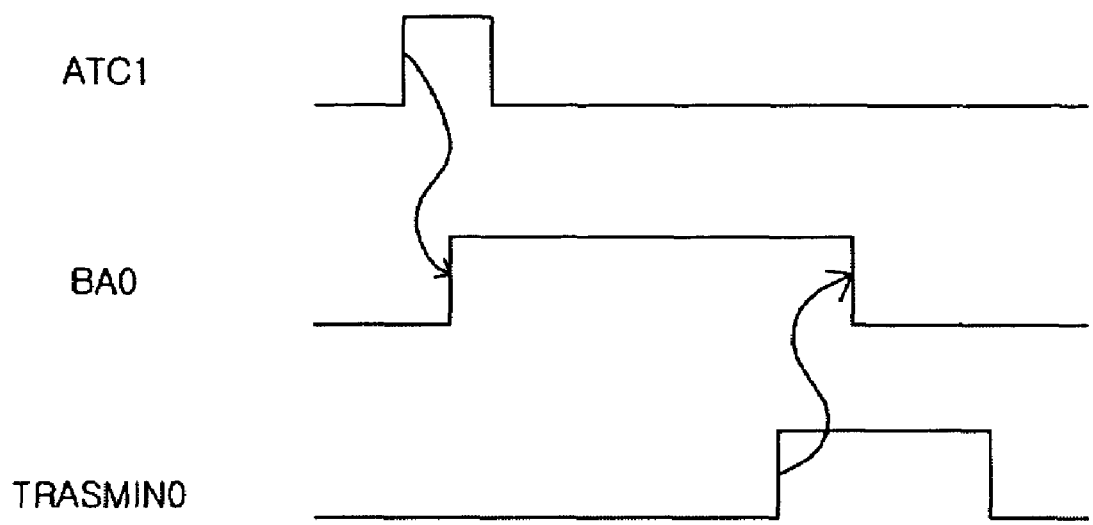
FIG. 7 is a waveform diagram illustrating the operation of the active signal generating unit shown in FIG. 6.

FIG. 4 is a block diagram illustrating the structure of an apparatus for controlling an active period of a semiconductor memory apparatus according to an embodiment of the present invention. FIG. 5 is a circuit diagram illustrating the internal structure of an active control unit shown in FIG. 4. FIG. 6 is a circuit diagram illustrating the internal structure of an active signal generating unit shown in FIG. 4. FIG. 7 is a waveform diagram illustrating the operation of the active signal generating unit shown in FIG. 6.

The apparatus for controlling an active period of a semiconductor memory apparatus according to an embodiment of the present invention has, for example, four banks. As shown in FIG. 4, the apparatus for controlling an active period of a semiconductor memory apparatus includes an active controller 40 that generates an active control signal for determining the active period of each bank according to whether a refresh operation is performed, a precharge signal generator 20 that generates a precharge signal on the basis of the active control signal, and an active signal generator 50 that generates an active signal for each bank so as to correspond to the active control signal.

The active controller 40 includes four active control units corresponding to the number of banks, that is, first to fourth active control units 41 to 44, as shown in FIG. 4. One of the first to fourth active control units 41 to 44 generates the active control signal regardless of whether the refresh operation is performed, and the other active control units generate the active control signals according to whether the refresh operation is performed. In this embodiment, the first active control unit 41 generates an active control signal TRASMIN0 regardless of whether the refresh operation is performed, and the second to fourth active control units 42 to 44 generate active control signals TRASMIN1 to TRASMIN3 according to the refresh operation, respectively.

In this case, as shown in FIG. 5, the first active control unit 41 includes an inverter 41-1 that inverts an active signal BA0_DLY delayed by a predetermined amount of time, a NAND gate 41-3 that receives the output of the inverter 41-1 and a high-level signal VDD and outputs a low-level signal when the two signals are at high levels, an inverter 41-4 that inverts the output of the NAND gate 41-3, and a delay element 41-5 that delays the output of the inverter 41-4 by a predetermined amount of time and outputs the active control signal TRASMIN0.

Since the second to fourth control units 42 to 44 have the same structure, one of the second to fourth control units 42 to 44, for example the second control unit 42, will be described below with reference to FIG. 5. As shown in FIG. 5, the second control unit 42 includes an inverter 42-1 that inverts the active signal BA1_DLY delayed by a predetermined amount of time, a NOR gate 42-2 that receives a self-refresh signal SREF and an auto-refresh signal AUTOREF and outputs a high-level signal when the two input signals are at low levels, a NAND gate 42-3 that receives the output of the inverter 42-1 and the output of the NOR gate 42-2 and outputs a low-level signal when the input signals are at high levels, an inverter 42-4 that inverts the output of the NAND gate 42-3, and a delay element 42-5 that delays the output of the inverter 42-4 by a predetermined amount of time and outputs the active control signal TRASMIN1.

The active signal generator 50 includes four active signal generating units corresponding to the number of banks, that is, first to fourth active signal generating units 51 to 54, as shown in FIG. 4. Unlike the related art in which the active control signal is input through an additional signal line, the active control signal TRASMIN0 output from the first active control unit 41 is input to several components through one line.

Since the first to fourth active signal generating units 51 to 54 have the same structure, one of the first to fourth active signal generating units 51 to 54, for example the second active signal generating unit 52, is described below with reference to FIG. 6. As shown in FIG. 6, the second active signal generating unit 52 includes a first determining unit 52-1 that determines whether to generate an active signal BA1 on the basis of a pulse FACT1 generated according to an external active instruction and a pulse ACT1 generated according to an internal active instruction, a second determining unit 52-2 that determines whether to generate the active signal BA1 on the basis of an auto-precharge signal APCG1 and the active control signal TRASMIN0, and a signal generating unit 52-3 that generates the active signal BA1 on the basis of the outputs of the first and second determining units 52-1 and 52-2.

The first determining unit 52-1 includes a NOR gate 52-4 that receives the pulse FACT1 generated according to the external active instruction and the pulse ACT1 generated according to the internal active instruction and outputs a high-level signal when at least one of the input pulses is at a low level. The second determining unit 52-2 includes: a NAND gate 52-5 that receives the active control signal TRASMIN0 and the refresh signal REF and outputs a high-level signal when at least one of the input signals is at a low level; an inverter 52-6 that inverts the output of the NAND gate 52-5; a first NOR gate 52-7 that receives the auto-precharge signal APCG1 and the output of the inverter 52-6 and outputs a low-level signal when at least one of the input signals is at a high level; and a second NOR gate 52-8 that receives a reset signal RST and a precharge signal RPE1 and determines whether to output an active signal. The signal generating unit 52-3 includes a latch that holds the output of the first determining unit 52-1 on the basis of the output of the second determining unit 52-2 and a driver that drives the output of the latch.

Next, the operation of the apparatus according to the invention having the above-mentioned structure will be described below.

First, as described above, the first active control unit 41 receives the active signal BA0_DLY delayed by a predetermined amount of time and outputs the active control signal TRASMIN0 having a high level, regardless of the self-refresh or auto-refresh operation. Then, the active control signal TRASMIN0 is supplied to the first to fourth active signal generating units 51 to 54, for example, through one signal line. The active control signal TRASMIN0 is also supplied to a first precharge signal generating unit 21.

As shown in FIG. 7, each of the first to fourth active signal generating units 51 and 54 outputs a high-level active signal BA0 on the basis of the pulse ACT1 generated according to the external or internal active instruction. When the active control signal TRASMIN0 having a high level is input, each of the first to fourth active signal generating units 51 and 54 outputs the active signal BA0 at a low level after a predetermined amount of time has elapsed.

That is, an enable period of the active signal is determined by the active control signal TRASMIN0.

Meanwhile, when at least one of the self-refresh signal SREF and the auto-refresh signal AUTOREF is at a high level, that is, in the refresh operation period, each of the second to fourth active control units 42 to 44 disables the corresponding active control signal TRASMIN1, TRASMIN2, or TRASMIN3, that is, changes the corresponding active control signal to a low level. That is, the second to fourth active control units 42 to 44 do not operate in the refresh operation period, which reduces current consumption to a minimum.

When both the self-refresh signal SREF and the auto-refresh signal AUTOREF are at low levels, that is, in periods other than the refresh operation period, the second to fourth active control units 42 to 44 change the corresponding active control signals TRASMIN1 to TRASMIN3 to high levels and output the active control signals to the first to fourth precharge signal generating units 21 and 24, respectively.

Then, the first to fourth precharge signal generating units 21 to 24 generate auto-precharge signals APCG0 to APCG3 on the basis of the active control signals TRASMIN0 to TRASMIN3, respectively.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

Accordingly, the apparatus and method for controlling an active period of semiconductor memory apparatus according to the disclosed embodiment of present invention can have the following effects.

First, all active control units except one active control unit do not operate during a self-refresh operation and an auto-refresh operation, which makes it possible to reduce current consumption to a minimum in a refresh mode.

Second, the number of signal lines for supplying active control signals to active signal generating units is reduced, which makes it possible to easily arrange the signal lines and thus to effectively use extra space.

What is claimed is:

1. An apparatus for controlling activation of a semiconductor integrated circuit divided into banks, comprising:
   a plurality of active control units configured to generate active control signals for determining activation of the divided banks; and
   a plurality of active signal generating units configured to generate active signals for input to the divided banks corresponding to the active control signals;
   wherein some of the plurality of active control units are configured to generate the active control signals regardless of activation of a refresh signal, and others of the plurality of active control units are configured to stop generating of the active control signals when the refresh signal is activated.

2. The apparatus for controlling the activation of a semiconductor integrated circuit of claim 1,
   wherein the active control signal generated by the some of the plurality of active control units is input to all of the active signal generating units.

3. The apparatus for controlling activation of a semiconductor integrated circuit of claim 1,
   wherein each of the some the plurality of active control units includes:
   a logic element having inputs to respectively receive a high-level signal and an inverted active signal of the active signal which is delayed by a first predetermined amount of time; and
   a delay element configured to delay the output of the logic element by a second predetermined amount of time.

4. The apparatus for controlling activation of a semiconductor integrated circuit of claim 1,
   wherein each of the others of the plurality of active control units includes:
   a logic element having inputs to respectively receive an inverted signal of the refresh signal and an inverted active signal of the active signal which is delayed by a first predetermined amount of time; and a delay element configured to delay the output of the logic element by a second predetermined amount of time.

5. The apparatus for controlling activation of a semiconductor integrated circuit of claim 1,
wherein one of the active control units is configured to generate the active control signal regardless of activation of the refresh signal.

6. The apparatus for controlling activation of a semiconductor integrated circuit of claim 1,
wherein a number of the plurality of active signal generating units correspond to the number of the banks.

7. The apparatus for controlling activation of a semiconductor integrated circuit of claim 6,
wherein each of the plurality of active signal generating units includes:
a first determining unit having an output and configured to determine whether to generate the active signal according to an active instruction;
a second determining unit having an output and configured to determine whether to generate the active signal based on an auto-precharge signal and the active control signal; and
a signal generating unit configured to generate the active signal based on the outputs of the first and second determining units.

8. The apparatus for controlling activation of a semiconductor integrated circuit of claim 7,
wherein the first determining unit includes a logic element having respective inputs to receive a first pulse generated according to an external active instruction and a second pulse generated according to an internal active instruction.

9. The apparatus for controlling activation of a semiconductor integrated circuit of claim 7,
wherein the second determining unit includes:
a first logic element having respective inputs to receive the active control signal and the refresh signal;
a second logic element having respective inputs to receive the auto-precharge signal and the output of the first logic element.

10. The apparatus for controlling activation of semiconductor integrated circuit of claim 7,
wherein the signal generating unit includes a latch configured to hold the output of the first determining unit based on the output of the second determining unit.

11. The apparatus for controlling activation of a semiconductor integrated circuit of claim 1, further comprising:
a precharge signal generating unit configured to generate a precharge signal based on the active control signal and to supply the precharge signal to the plurality of active signal generating units.

12. A method for controlling an apparatus for controlling activation of a semiconductor integrated circuit having a plurality of banks, a plurality of active control units configured to generate active control signals for determining active periods of the plurality of banks, and a plurality of active signal generating units configured to generate active signals input to the plurality of banks corresponding to the active control signals, the method comprising:
generating the active control signals with some of the plurality of active control units regardless of activation of a refresh signal; and
stopping generating the active control signals with others of the plurality of active control units when the refresh signal is activated.

13. The method for controlling an apparatus for controlling activation of a semiconductor integrated circuit of claim 12,
generating the active control signal with one of the active control units regardless of activation of the refresh signal.

14. The method for controlling an apparatus for controlling activation of a semiconductor integrated circuit of claim 12, further comprising:
inputting the active control signal generated by the some of the plurality of active control units to all of the active signal generating units.

* * * * *